(12) United States Patent
Lee et al.

(10) Patent No.: US 9,577,114 B2
(45) Date of Patent: Feb. 21, 2017

(54) TRANSISTORS, METHODS OF FORMING TRANSISTORS AND DISPLAY DEVICES HAVING TRANSISTORS

(71) Applicant: SAMSUNG DISPLAY CO., LTD., Yongin-si, Gyeonggi-do (KR)

(72) Inventors: Jin-Woo Lee, Yongin-si (KR); Moo-Jin Kim, Yongin-si (KR)

(73) Assignee: SAMSUNG DISPLAY CO., LTD., Yongin, Gyeonggi-Do (KR)

(*) Notice: Subject to any disclaimer, the term of this patent is extended or adjusted under 35 U.S.C. 154(b) by 0 days.

(21) Appl. No.: 15/147,628

(22) Filed: May 5, 2016

(65) Prior Publication Data

US 2016/0247943 A1 Aug. 25, 2016

Related U.S. Application Data

(62) Division of application No. 14/206,071, filed on Mar. 12, 2014, now Pat. No. 9,337,280.

(30) Foreign Application Priority Data

Apr. 4, 2013 (KR) ........................ 10-2013-0036693

(51) Int. Cl.
*H01L 21/02* (2006.01)
*H01L 29/786* (2006.01)
(Continued)

(52) U.S. Cl.
CPC ..... *H01L 29/78696* (2013.01); *H01L 21/0237* (2013.01); *H01L 21/02527* (2013.01); *H01L 21/02532* (2013.01); *H01L 21/02592* (2013.01); *H01L 21/02675* (2013.01); *H01L 21/465* (2013.01); *H01L 27/3262* (2013.01); *H01L 29/04* (2013.01); *H01L 29/1054* (2013.01); *H01L 29/165* (2013.01); *H01L 29/1606* (2013.01); *H01L 29/267* (2013.01); *H01L 29/42356* (2013.01); *H01L 29/66045* (2013.01); *H01L 29/66431* (2013.01); *H01L 29/66742* (2013.01); *H01L 29/66757* (2013.01);
(Continued)

(58) Field of Classification Search
CPC ........... H01L 21/0237; H01L 21/02527; H01L 21/02532; H01L 21/02592
See application file for complete search history.

(56) References Cited

U.S. PATENT DOCUMENTS

2011/0151601 A1   6/2011   Kim et al.
2012/0161098 A1   6/2012   Hiura et al.
(Continued)

FOREIGN PATENT DOCUMENTS

KR   10-2002-0060919 A   7/2002
KR   10-2011-0071700 A   6/2011
KR   10-2011-0081638 A   7/2011

*Primary Examiner* — Douglas Menz
(74) *Attorney, Agent, or Firm* — Lee & Morse, P.C.

(57) ABSTRACT

A transistor, a display device, and associated methods, the transistor including a substrate; an active layer pattern disposed on the substrate, the active layer pattern including silicon and graphene; a gate insulating layer disposed on the active layer pattern; a gate electrode disposed on the gate insulating layer; an insulating interlayer covering the active layer pattern and the gate electrode; and a source electrode and a drain electrode in contact with the active layer pattern.

9 Claims, 8 Drawing Sheets

(51) Int. Cl.
  *H01L 29/66*   (2006.01)
  *H01L 29/165*   (2006.01)
  *H01L 29/267*   (2006.01)
  *H01L 29/778*   (2006.01)
  *H01L 29/10*   (2006.01)
  *H01L 29/16*   (2006.01)
  *H01L 21/465*   (2006.01)
  *H01L 27/32*   (2006.01)
  *H01L 29/04*   (2006.01)
  *H01L 29/423*   (2006.01)

(52) U.S. Cl.
  CPC .... *H01L 29/66969* (2013.01); *H01L 29/7781* (2013.01); *H01L 29/7782* (2013.01); *H01L 29/7869* (2013.01); *H01L 29/78684* (2013.01)

(56) References Cited

U.S. PATENT DOCUMENTS

2012/0205626 A1   8/2012  Dimitrakopoulos et al.
2012/0211723 A1*  8/2012 Dimitrakopoulos  H01L 21/02378
              257/9
2012/0326126 A1*  12/2012  Chen ................ H01L 29/42384
               257/29

* cited by examiner

TRANSISTORS, METHODS OF FORMING TRANSISTORS AND DISPLAY DEVICES HAVING TRANSISTORS

CROSS REFERENCE TO RELATED APPLICATIONS

This is a divisional application based on pending application Ser. No. 14/206,071, filed Mar. 12, 2014, the entire contents of which is hereby incorporated by reference.

Korean Patent Application No. 10-2013-0036693 filed on Apr. 4, 2013, in the Korean Intellectual Property Office, and entitled: "TRANSISTORS, METHODS OF FORMING TRANSISTORS AND DISPLAY DEVICES HAVING TRANSISTORS," is incorporated by reference herein in its entirety.

BACKGROUND

1. Field

Embodiments relate to transistors, methods forming transistors and display devices having transistors.

2. Description of the Related Art

In some transistors, an active layer may include a semiconductor material such as amorphous silicon or polysilicon.

SUMMARY

According to one aspect of example embodiments, there is provided a transistor including a substrate, an active layer pattern disposed on the substrate, the active layer pattern including silicon and graphene, a gate insulating layer disposed on the active layer pattern, a gate electrode disposed on the gate insulating layer, an insulating interlayer covering the active layer pattern and the gate electrode and a source electrode and a drain electrode in contact with the active layer pattern.

In example embodiments, the active layer pattern may include a polycrystalline silicon layer pattern disposed on the substrate and graphene layer pattern buried in the polycrystalline silicon layer.

In example embodiments, the polycrystalline silicon layer pattern has a first area and the graphene layer pattern has a second area smaller than the first area.

In example embodiments, the graphene layer pattern is in contact with the source electrode and the drain electrode.

In example embodiments, the active layer pattern further comprises an additional polycrystalline silicon layer pattern disposed on the graphene layer pattern.

In example embodiments, the graphene layer pattern has a nanoribbon shape or a stripe shape.

According to one aspect of some example embodiments, there is provided a transistor including a substrate, a gate electrode disposed on the substrate, a gate insulating layer disposed on the gate electrode, a source electrode and a drain electrode disposed on the gate insulating layer and an active layer pattern disposed on a portion of the gate insulating layer, the source electrode and the drain electrode, the active layer pattern including graphene and a semiconductor oxide.

In example embodiments, the active layer pattern may include graphene layer pattern disposed on the portion of the gate insulating layer, the source electrode and the drain electrode and a semiconductor oxide layer pattern disposed on the graphene layer pattern, the source electrode and the drain electrode.

In example embodiments, the semiconductor oxide layer pattern includes the semiconductor oxide, the semiconductor oxide including at least one selected from the group of indium (In), zinc (Zn), gallium (Ga), tin (Sn), titanium (Ti), aluminum (Al), hafnium (Hf), zirconium (Zr) and magnesium (Mg).

In example embodiments, the semiconductor oxide layer pattern includes a composition in which at least one selected from the group of lithium (Li), sodium (Na), manganese (Mn), nickel (Ni), palladium (Pd), copper (Cu), carbon (C), nitrogen (N), phosphorus (P), titanium (Ti), zirconium (Zr), vanadium (V), rubidium (Ru), germanium (Ge), tin (Sn), and fluorine (F) is added to the semiconductor oxide.

In example embodiments, the graphene layer pattern is contact with the source electrode and the drain electrode.

According to another aspect of example embodiments, there is provided a method of manufacturing a transistor. In the method, an active layer pattern silicon graphene may be formed on a substrate such that the active layer pattern includes silicon and graphene. A gate insulating layer may be formed on the active layer pattern. A gate electrode may be formed on the gate insulating layer. A source electrode and a drain electrode may be formed on the gate insulating layer.

In example embodiments, forming the active layer pattern may include forming an amorphous silicon layer on the substrate, forming a preliminary graphene layer on the amorphous silicon layer and irradiating a laser onto the preliminary graphene layer and the amorphous silicon layer.

In example embodiments, irradiating the laser onto the preliminary graphene layer and the amorphous silicon layer may include irradiating a first laser onto the preliminary graphene layer to melt the preliminary graphene layer into the amorphous silicon layer and irradiating a second laser onto the amorphous silicon layer to crystallize the amorphous silicon layer into a polycrystalline silicon layer.

In example embodiments, forming the active layer pattern may include a laser irradiation process, a thermal treatment process, or a thermal treatment process using a catalyst.

According to another aspect of some example embodiments, there is provided a method of manufacturing a transistor. In the method, a gate electrode may be formed on a substrate. A gate insulating layer covering the gate electrode may be formed on the substrate. A source electrode and a drain electrode may be formed on the gate insulating layer and an active layer pattern may be formed on a portion of the gate insulating layer, the source electrode, and the drain electrode such that the active layer pattern may include graphene and a semiconductor oxide.

In example embodiments, the active layer pattern is formed by a sputtering process, a chemical vapor deposition process, an atomic layer deposition process or a vacuum deposition process.

In example embodiments, forming the active layer pattern may comprise forming graphene layer on the portion of the gate insulating layer, the source electrode and the drain electrode, partially etching the semiconductor oxide layer and the graphene layer to form the semiconductor oxide layer on the graphene layer and forming an active layer pattern having graphene layer pattern and a semiconductor oxide layer pattern.

According to another aspect of example embodiments, there is provided a display device including a first substrate, an active layer pattern disposed on the first substrate, the active layer pattern including silicon and graphene, a gate insulating layer disposed on the active layer pattern, a gate electrode disposed on the gate insulating layer, a source electrode and a drain electrode disposed on the gate electrode, a first electrode in electrical contact with the drain electrode, a light emitting structure disposed on the first electrode, a second electrode disposed on the light emitting structure and a second substrate disposed on the second electrode.

According to another aspect of some example embodiments, there is provided a display device including a first substrate, a gate electrode disposed on the first substrate; a gate insulating layer disposed on the gate electrode, a source electrode and a drain electrode disposed on the gate insulating layer, an active layer pattern disposed on a portion of the gate insulating layer, the source electrode and the drain electrode, the active layer pattern including graphene and a semiconductor oxide, a first electrode in electrical contact with the drain electrode, a light emitting structure disposed on the first electrode, a second electrode disposed on the light emitting structure and a second substrate disposed on the second electrode.

According to example embodiments of the invention, the transistor may include an active layer pattern having at least one of silicon and a semiconductor oxide and graphene, so that the transistor may obtain an enhanced electrical characteristic by preventing a the deterioration of the electrical characteristics such as a reducing of a bias current, a increasing of a threshold voltage distribution and a reducing of a mobility. The active layer pattern may have a structure where the graphene is buried in at least one of the silicon and the semiconductor oxide, so that the transistor may easily control characteristics of the active layer pattern, and may implement the transistor having a high reliability. When the transistor is employed in a display device such as a organic light emitting display device, a liquid crystal display device, a flexible display device, etc, the display device having the transistor may reduce a thickness, may increase a resolution of images displayed by the display device, and may improve a operating speed of images.

BRIEF DESCRIPTION OF THE DRAWINGS

Illustrative, non-limiting example embodiments will be more clearly understood from the following detailed description taken in conjunction with the accompanying drawings.

DETAILED DESCRIPTION

Figure 1:
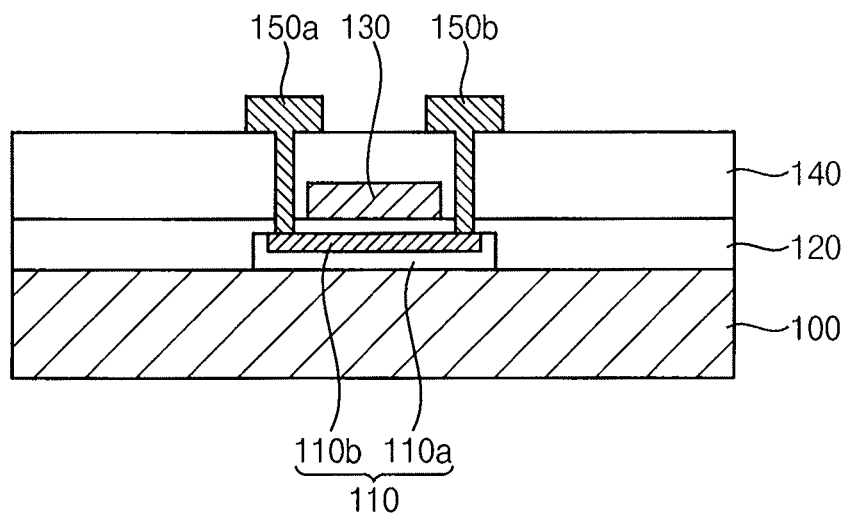
FIG. 1 illustrates a cross sectional view of a transistor in accordance with example embodiments.

Various embodiments will be described more fully hereinafter with reference to the accompanying drawings, in which some embodiments are shown. The embodiments, however, be embodied in many different forms and should not be construed as limited to the embodiments set forth herein. Rather, these embodiments are provided so that this description will be thorough and complete, and will fully convey the scope of the embodiments to those skilled in the art. In the drawings, the sizes and relative sizes of layers and regions may be exaggerated for clarity.

It will be understood that when an element or layer is referred to as being "on," "coupled to" or "coupled to" another element or layer, it can be directly on, coupled or coupled to the other element or layer or intervening elements or layers may be present. In contrast, when an element is referred to as being "directly on," "directly coupled to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (for example, rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include a plurality of forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the face through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a cross sectional view of a transistor in accordance with example embodiments.

Referring to FIG. 1, a transistor may be provided on a substrate 100. The transistor may include an active layer pattern 110 including silicon and graphene, a gate insulating layer 120, a gate electrode 130, an insulating interlayer 140, a source electrode 150a, a drain electrode 150b, or the like.

The substrate 100 may include a glass substrate, a transparent resin substrate, a transparent metal oxide substrate, or the like. Examples of the transparent resin substrate for the substrate 100 may include polyimide-based resin, acryl-based resin, polyacrylate-based resin, polycarbonate-based resin, polyether-based resin, polyethylene terephthalate-based resin, sulfonic acid-containing resin, or the like.

In an implementation, a buffer layer (not illustrated) may be disposed on the substrate 100. The buffer layer may help prevent diffusion of impurities from the substrate 100. If the substrate 100 has a relatively irregular surface, the buffer layer may help improve flatness of the surface of the substrate 100. Additionally, the buffer layer may help adjust heat transfer rate of a subsequent crystallization process for an active layer, thereby ensuring a substantially uniform active layer. The buffer layer may be formed using silicon compound. For example, the buffer layer may include silicon oxide (SiOx), silicon nitride (SiNx), silicon oxynitride (SiOxNy), silicon oxycarbide (SiOxCy), silicon carbonnitride (SiCxNy), or the like. These may be used alone or in a mixture thereof.

The active layer pattern 110 may be disposed on the substrate 100. In an implementation, the buffer layer may be interposed between the substrate 100 and the active layer pattern 110. Alternatively, the active layer pattern 110 may be directly disposed on the substrate 100 without the buffer layer. The active layer pattern 110 may include, e.g., a polycrystalline silicon layer pattern 110a and graphene layer pattern 110b. In an implementation, an amorphous silicon layer may be formed on the substrate 100 or the buffer layer, and graphene layer may be formed on the amorphous silicon layer. For example, the amorphous silicon layer and the graphene layer may be formed by a sputtering process, a chemical vapor deposition (CVD) process, an atomic layer deposition (ALD) process, a vacuum deposition process, or the like. In an implementation, an active layer including the amorphous silicon layer and the graphene layer may be formed by performing a crystallization process. Thereafter, the active layer pattern 110 including a polycrystalline silicon layer pattern 110a and the graphene layer pattern may be formed by patterning the active layer. For example, the crystallization process for forming the active layer including the polycrystalline silicon layer and the graphene layer may include a laser irradiation process, a thermal treatment process, a thermal process utilizing a catalyst, or the like.

In an implementation, the active layer pattern 110 may include a structure in which the graphene layer pattern 110b is substantially buried in or surrounded by the polycrystalline silicon layer pattern 110a. In some example embodiments, the graphene layer pattern 110b may have a nanoribbon shape, a stripe shape, or the like. The graphene layer pattern 110b may be buried in the polycrystalline silicon layer pattern 110a that has a first area. The graphene layer pattern 110b may have a second area that is smaller than the first area. In an implementation, an upper surface of the graphene layer pattern 110b and an upper surface of the polycrystalline silicon layer pattern 110a may be positioned on the substantially same plane surface, e.g., the upper surface of the graphene layer pattern 110b may be coplanar with the upper surface of the polycrystalline silicon layer pattern 110a. A disposition relationship between the graphene layer pattern 110b and the polycrystalline silicon layer pattern 110a will be described below in detail.

In some example embodiments, the active layer pattern 110 may further include an additional polycrystalline silicon layer pattern (not illustrated) disposed on the graphene layer pattern 110b and the polycrystalline silicon layer pattern 110a. When the active layer pattern 110 includes a structure where the graphene layer pattern is interposed between the two polycrystalline silicon layer patterns, the active layer pattern 110 may easily improve the characteristics of the transistor, as will be described below.

Referring back to FIG. 1, the gate insulating layer 120 may be disposed on the active layer pattern 110 and the substrate 100. In example embodiments, the gate insulating layer 120 may have a substantially flat or level surface such that a stepped portion may not be generated at a portion of the gate insulating layer 120 adjacent to the active layer pattern 110. The gate insulating layer 120 may include silicon oxide, metal oxide, or the like. Examples of the metal oxide in the gate insulating layer 120 may include silicon oxide (SiOx), silicon nitride (SiNx), aluminum oxide (AlOx), tantalum oxide (TaOx), hafnium oxide (HfOx), zirconium oxide (ZrOx), titanium oxide (TiOx), or the like. These may be used alone or in a combination thereof.

The gate electrode 130 may be disposed on the gate insulating layer 120. The gate electrode 130 may be positioned on a portion of the gate insulating layer 120 under which the active layer pattern 110 is located, i.e., that overlies the active layer pattern 110. The gate electrode 130 may include a metal, an alloy, a conductive metal oxide, a transparent conductive material, or the like. For example, the gate electrode 130 may be formed using aluminum (Al), an alloy containing aluminum, aluminum nitride (AlNx), silver (Ag), an alloy containing silver, tungsten (W), tungsten nitride (WNx), copper (Cu), an alloy containing copper, nickel (Ni), an alloy containing nickel, chromium (Cr), chromium nitride (CrNx), molybdenum (Mo), an alloy containing molybdenum, titanium (Ti), titanium nitride (TiNx), platinum (Pt), tantalum (Ta), tantalum nitride (TaNx), neodymium (Nd), scandium (Sc), strontium ruthenium oxide (SrO), zinc oxide (ZnOx), indium tin oxide (ITO), tin oxide (SnOx), indium oxide (InOx), gallium oxide (GaOx), indium zinc oxide (IZO), or the like. These may be used alone or in a combination thereof.

In some example embodiments, when the gate electrode 130 includes the transparent conductive material as noted above, the compositions of the transistor may include the fully transparent materials as described below. Thus, the transistor may be employed in a transparent flexible display device having a low thickness.

The insulating interlayer 140 may be disposed on the gate insulating layer 130 to cover the active layer pattern 110 and the gate electrode 130. The insulating interlayer 140 may include silicon oxide, metal oxide, or the like. Examples of metal oxide in the insulating interlayer 140 may include silicon oxide (SiOx), silicon nitride (SiNx), aluminum oxide (AlOx), tantalum oxide (TaOx), hafnium oxide (HfOx), zirconium oxide (ZrOx), titanium oxide (TiOx), or the like. These may be used alone or in a mixture thereof.

The source electrode 150a and the drain electrode 150b may be disposed on the insulating interlayer 140. The source electrode 150a and the drain electrode 150b may pass through the insulating interlayer 140, and may contact the active layer pattern 110, respectively. The source electrode 150a and the drain electrode 150b may be separated from each other by a predetermined distance while substantially centering the gate electrode 130 therebetween. In example embodiments, each of the source electrode 150a and the drain electrode 150b may include metal, an alloy, and/or a metal nitride. For example, the source electrode 150a and the drain electrode 150b may be formed using aluminum, copper, molybdenum, titanium, chromium, tantalum, tungsten, neodymium, scandium, an alloy thereof, a nitride thereof, or the like. These may be used alone or in a combination thereof. In some example embodiments, the source electrode 150a and the drain electrode 150b may be formed using a transparent conductive material. For example, each of the source electrode 150a and the drain electrode 150b may include indium tin oxide (ITO), indium zinc oxide (IZO), tin oxide (SnOx), indium oxide (InOx), carbon nano tube (CNT), or the like.

Figure 2:
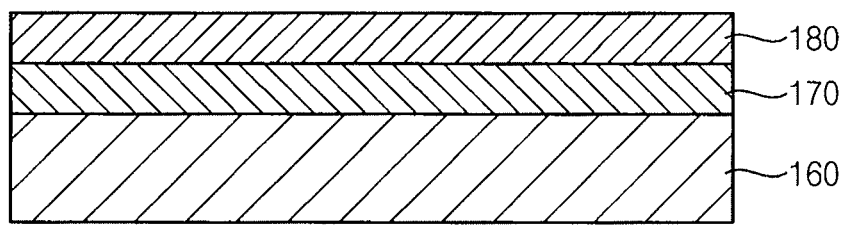
FIGS. 2 to 7 illustrate cross sectional views of stages in a method of forming a transistor in accordance with example embodiments.
Figure 3:
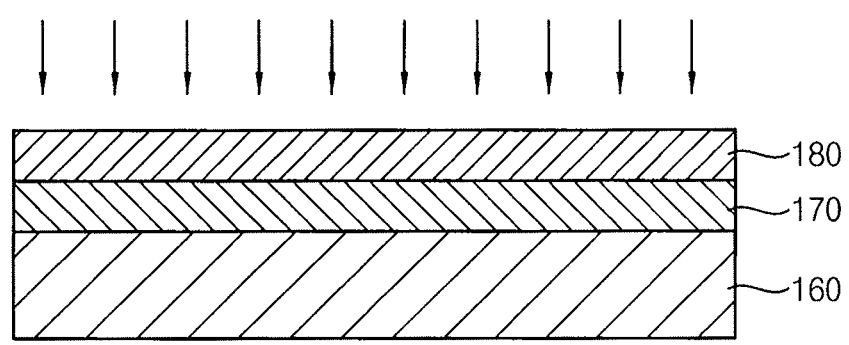
Figure 4A:
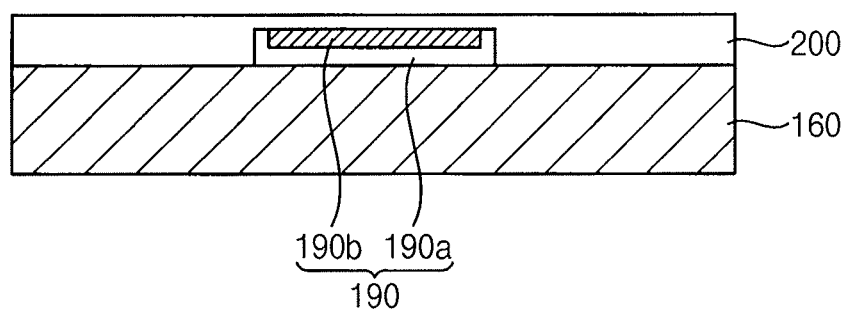
Figure 4B:
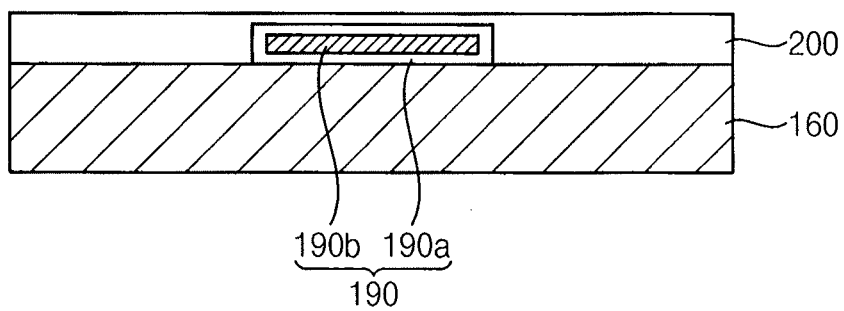

FIGS. 2 to 7 illustrate cross sectional views of stages in a method of forming a transistor in accordance with example embodiments and FIGS. 4A and 4B are diagrams illustrating a method of manufacturing the transistor in accordance with different example embodiments. In FIGS. 2 to 7, a method of manufacturing the transistor substantially the same as or substantially similar to the transistor described above with reference to FIG. 1 will be described. However, it will be appreciated that the method of manufacturing the transistor illustrated in FIGS. 2 to 7 may be employed in other transistors having various configurations where the active layer, the gate insulating layer, the gate electrode, the insulating interlayer, the source electrode, the drain electrode, or the like, may be disposed in various forms.

Referring to FIG. 2, an amorphous silicon layer 170 and a preliminary graphene layer 180 may be sequentially formed on a substrate 160 (that includes a transparent insulating substrate such as a glass substrate, a transparent resin substrate, a transparent metal oxide substrate, or the like). For example, the amorphous silicon layer 170 and the preliminary graphene layer 180 may be formed on the substrate 160 by a sputtering process, a chemical vapor deposition process, an atomic layer deposition process, a vacuum deposition process, or the like. Although FIG. 2 illustrates an example where the amorphous silicon layer 170 and the preliminary graphene layer 180 have substantially the same thickness, in some example embodiments, the amorphous silicon layer 170 and the preliminary graphene layer 180 may have different thicknesses.

In some example embodiments, a buffer layer (not illustrated) may be formed on the substrate 160, and the amorphous silicon layer 170 and the preliminary graphene layer 180 may be sequentially formed on the buffer layer. In this case, the buffer layer may have a single layer structure or a multi layer structure including the silicon compound.

Referring to FIG. 3, in order to form an active layer, a crystallization process may be performed on the amorphous silicon layer 170 and the preliminary graphene layer 180. During the crystallization process according to example embodiments, a laser beam may be irradiated onto the preliminary graphene layer 180 from a prescribed light source (not illustrated). In this case, the laser beam may be irradiated onto the front surface of the preliminary graphene layer 180. Additionally, the laser beam may be irradiated onto some regions of the preliminary graphene layer 180. For example, a first laser beam may be irradiated onto the surface of the preliminary graphene layer 180, thereby to melt into the amorphous silicon layer 170. Accordingly, graphene layer (not illustrated) substantially buried in or surrounded by the amorphous silicon layer 170 may be formed. Then, the amorphous silicon layer 170 may be transformed into a polycrystalline silicon layer (not illustrated) by irradiating a second laser beam onto the amorphous silicon layer 170 (in which the graphene layer is buried). Accordingly, the active layer including the polycrystalline silicon layer and the graphene layer may be achieved or formed. In some example embodiments, the first and the second laser beam may have a power density from about 0.3 J/cm$^2$ to about 3 J/cm$^2$. In this case, the first and the second laser beam may include an excimer laser having a wavelength from about 180 nm to about 400 nm, but is not limited thereto. Although it has been described above with reference to FIG. 3 that the active layer may be formed by the laser irradiation process, the active layer may be formed at least one of various other processes. For example, the active layer may be formed by the laser irradiation process, thermal treatment process, thermal treatment process using the catalyst, or the like.

Referring to FIG. 4A, the active layer pattern 190 (including the polycrystalline silicon layer pattern 190a and the graphene layer pattern 190b) may be formed by partially etching the polycrystalline silicon layer in which the graphene layer is substantially buried. In example embodiments, the polycrystalline silicon layer pattern 190a may have a first area, and the graphene layer pattern 190b may have a second area that is smaller than, e.g., substantially smaller than, the first area. For example, the active layer pattern 190 including the polycrystalline silicon layer pattern 190a and the graphene layer pattern 190b may be formed by a photolithography process or an etching process using an additional etching mask. The graphene layer pattern 190b may have a single layer structure or a multi layer structure according to an intensity of the laser beam, irradiating time, or the like. The graphene layer pattern 190b may substantially have a nanoribbon shape or a stripe shape.

In some example embodiments, the graphene layer pattern 190b illustrated in FIG. 4B may further include an additional polycrystalline silicon layer pattern (not illustrated) disposed on the graphene layer pattern 190b. In this case, characteristics of the graphene in the graphene layer pattern 190b may be easily controlled, so that a deterioration of electrical characteristics (such as a reduction of a bias current including the active layer pattern 190, an increase of a threshold voltage distribution, and a reduction of mobility) may be prevented. When the transistor having a high reliability (by ensuring the improved electrical characteristics) is employed in a display device (such as an organic light emitting display device, a liquid crystal display device, a flexible display device, or the like), the display device having the transistor may have a reduced thickness, may exhibit an increase in resolution of images displayed by the display device, and may exhibit improved operating speed of images.

Figure 5:
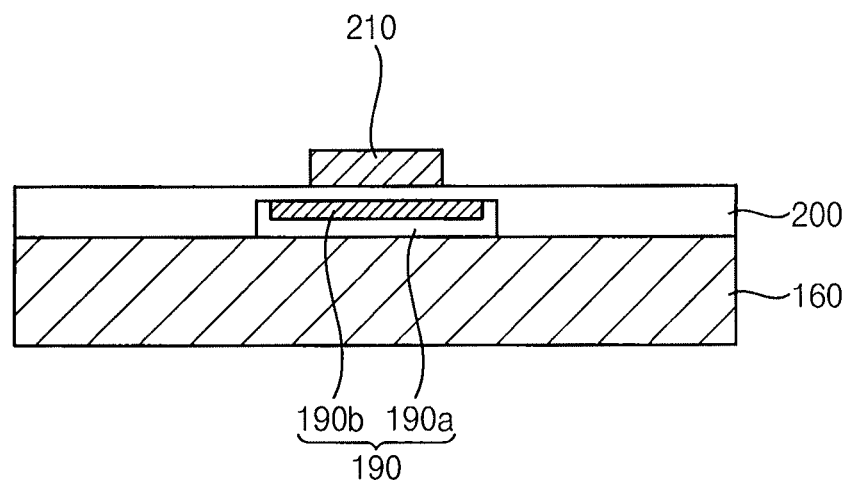

Referring to FIG. 5, the gate insulating layer 200 may be formed on the active layer pattern 190. The gate insulating layer 200 may be formed by a CVD process, a thermal oxidation process, a plasma enhanced chemical vapor deposition (PECVD) process, a high density plasma-chemical vapor deposition (HDP-CVD) process, or the like. The gate insulating layer 200 may have a single layer structure or a multi layer structure, which may include silicon compound and/or a metal oxide.

The gate electrode 210 may be located on the gate insulating layer 200. In example embodiments, a first conductive layer (not illustrated) may be formed on the gate insulating layer 200. Thereafter, the first conductive layer may be partially etched by a photolithography process or an etching process using an additional etching mask. Hence, the gate electrode 210 may be provided on the gate insulating layer 200. The first conductive layer may be formed by a sputtering process, a CVD process, an ALD process, a vacuum evaporation process, a printing process, or the like. The gate electrode 210 may have a single layer structure or a multi layer structure, which may include a conductive material, a heat resistance material, and/or a transparent conductive material.

Impurities may be implanted using the gate electrode 210 as a mask, thereby forming a source and a drain region (not illustrated) at both side portions of the active layer pattern 190. Accordingly, a portion of the active layer pattern 190 between the source region and the drain region may be defined as a channel region (not illustrated). For example, the source region and the drain region may be formed by an ion implantation process.

Figure 6:
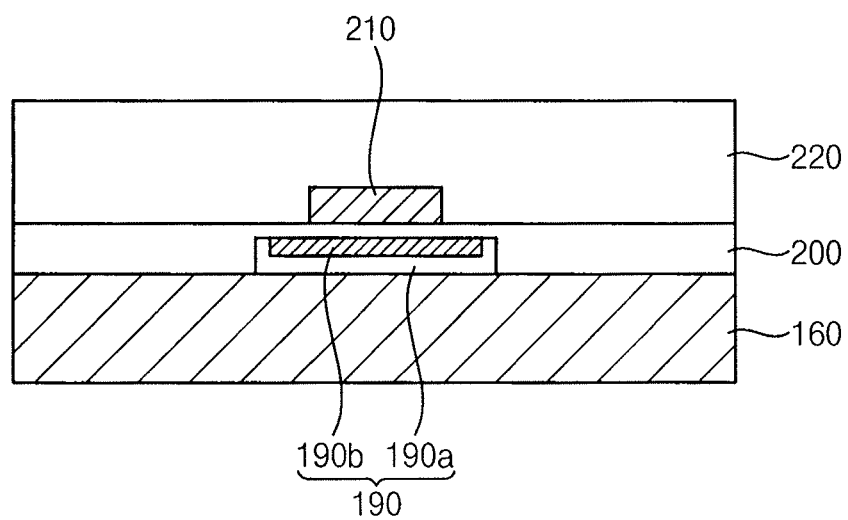

Referring to FIG. 6, an insulating interlayer 220 may be disposed on the gate insulating layer 200 to cover the active layer pattern 190 and the gate electrode 210. The insulating interlayer 220 (having a substantially uniform thickness) may be conformally formed on the gate insulating layer 200 along a profile of the gate electrode 210. The insulating interlayer 220 may be formed by a CVD process, a thermal oxidation process, a PECVD process, a HDP-CVD process, or the like. The insulating interlayer 220 may have a single layer structure or a multi layer structure, which may include silicon compound and/or a metal oxide.

Figure 7:
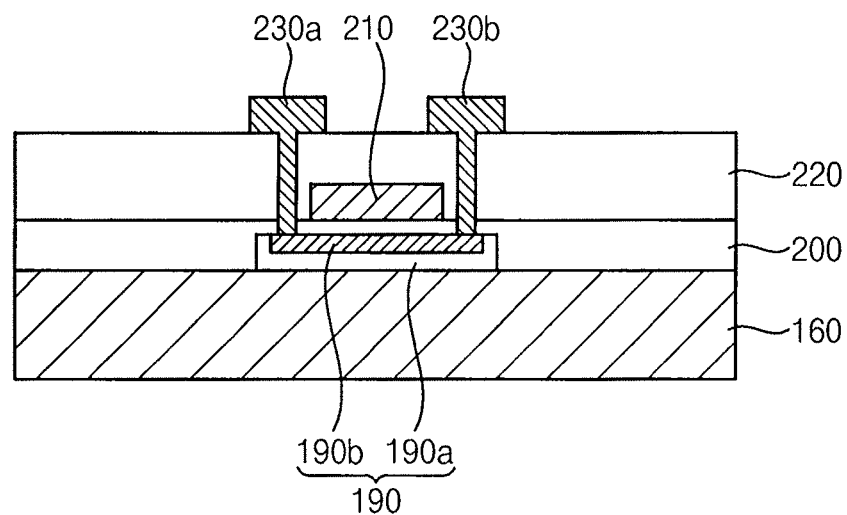

Referring to FIG. 7, in example embodiments, the insulating interlayer 220 and the gate insulating layer 220 may be partially etched to form contact holes exposing the source and the drain regions, respectively. Thereafter, the source electrode 230a and the drain electrode 230b may be formed in the contact holes. The source and the drain electrodes 230a and 230b may be separated from each other by a predetermined distance, while substantially centering the gate electrode 210, and may be formed adjacent to the gate electrode 210. Portions of the graphene layer pattern 190b of the active layer pattern 190 may be exposed by the contact holes, so that the source electrode 230a and the drain electrode 230b may contact, e.g., directly contact, the graphene layer pattern 190b.

In example embodiments, the insulating interlayer 220 and the gate insulating layer 200 may be partially etched to form contact holes that partially expose the source and the drain regions. Then, a second conductive layer (not illustrated) may be formed on the insulating interlayer 220 to fill the contact holes. The second conductive layer may be formed by a sputtering process, a CVD process, an ALD process, a vacuum evaporation process, a printing process, or the like. Then, the second conductive layer may be patterned to form the source electrode 230a and the drain electrode 230b described with reference to FIG. 7. For example, the source electrode 230a and the drain electrode 230b may be formed by the photolithography process or the etching process using an additional etching mask. Accordingly, the graphene layer pattern 190b may be electrically connected to the source electrode 230a and the drain electrode 230b. Each of the source and the drain electrodes 230a and 230b may have a single layer structure or a multi layer structure, which may include a metal, an alloy, a metal nitride, a conductive metal oxide, a transparent conductive material, or the like. The source electrode 230a and the drain electrode 230b may be seen with reference to FIG. 7, and the source electrode 230a and the drain electrode 230b may be specifically disposed. However, the embodiments are not limited thereto. For example, the source electrode 230a and the drain electrode 230b may be alternately disposed.

Figure 8:
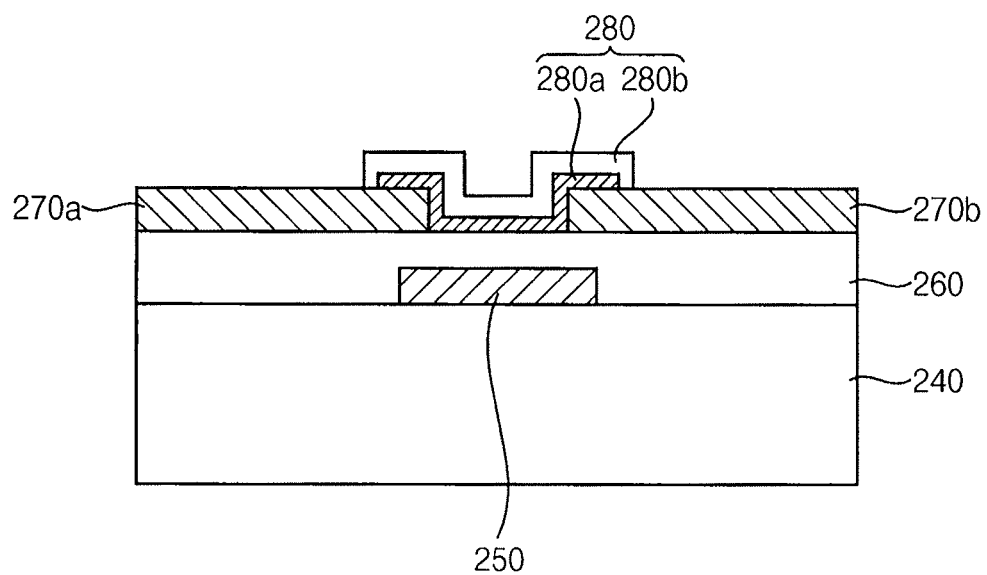
FIG. 8 illustrates a cross sectional view of a transistor in accordance with some example embodiments.

FIG. 8 illustrates a cross sectional view of a transistor in accordance with some example embodiments.

Referring to FIG. 8, a transistor may be provided on a substrate 240, and may include a gate electrode 250, a gate insulating layer 260, a source electrode 270a, a drain electrode 270b, an active layer pattern 280 including graphene and a semiconductor oxide, or the like.

The substrate 240 may include a glass substrate, a transparent resin substrate, a transparent metal oxide substrate, or the like. In example embodiments, a buffer layer (not illustrated) may be disposed on the substrate 240. The buffer layer may help prevent diffusion of impurities from the substrate 240, and may help improve flatness of the surface of the substrate 240. Additionally, when the buffer layer is on the substrate 240, the gate electrode 250 may be easily formed, as stress generated during forming the gate electrode 250 may be decreased by the buffer layer. The buffer layer may be formed using silicon compound.

The gate electrode 250 may include a metal, an alloy, a conductive metal oxide, a transparent conductive material, or the like. The gate insulating layer 260 may be disposed on the substrate 240 to cover the gate electrode 250. The gate insulating layer 260 may have a substantially flat or level surface, such that a stepped portion may not be generated at a portion of the gate insulating layer 260 adjacent to the gate electrode 250. The gate insulating layer 260 may include silicon oxide, metal oxide, or the like.

As illustrated in FIG. 8, the source electrode 270a and the drain electrode 270b may be formed on the gate insulating layer 260. In example embodiments, each of the source electrode 270a and the drain electrode 270b may have a substantially flat or level surface such that a stepped portion may not be generated at a portion of the source electrode 270a and the drain electrode 270b adjacent to the gate insulating layer 260. Each of the source electrode 270a and the drain electrode 270b may include a metal, an alloy, and/or a metal nitride.

In example embodiments, the source electrode 270a and the drain electrode 270b may be separated from each other by a predetermined distance, while exposing a portion of the gate insulating layer 260 (under which the gate electrode 250 is located). Accordingly, each of the source the drain electrodes 270a and 270b may be symmetrically disposed on the gate insulating layer 260 and centering the underlying gate electrode 250.

In some example embodiments, an additional layer(s), such as an etching preventing layer (not illustrated), a protecting layer (not illustrated), or the like, may be formed between the source the drain electrodes 270a and 270b and the gate insulating layer 260. In this case, the etching preventing layer and/or the protecting layer may include a material having an etching selectivity about the drain electrode 270a, 270b and the gate insulating layer 260. For example, the etching preventing layer and/or the protecting layer may include silicon oxide, silicon nitride, silicon oxy nitride, semiconductor oxide, or the like.

Referring now to FIG. 8, the active layer pattern 280 may be disposed on the exposed gate insulating layer 260, the source electrode 270a, and the drain electrode 270b. In example embodiments, the active layer pattern 280 may cover one side of the source electrode 270a, the gate insulating layer exposed between the source electrode 270a and the drain electrode 270b, and one side of the drain electrode 270b. Additionally, one side of the active layer pattern 280 may extend toward or overlie a portion of the source electrode 270a and another side of the active layer pattern 280 may extend toward or to overlie a portion of the drain electrode 270b. Accordingly, one and another side of the active layer pattern 280 may be positioned over both sides of the gate electrode 250. The active layer pattern 280 may be disposed on the portion of the gate insulating layer 260, the source electrode 270a, and the drain electrode 270b. Thus, stepped portions may be formed on both sides of the active layer pattern 280. For example, the active layer pattern 280 may include a cross sectional structure having a substantially "U" shape that includes stepped portions on the both sides.

The active layer pattern 280 may include the graphene layer pattern 280a and the semiconductor oxide layer pattern 280b. In example embodiments, the semiconductor oxide layer pattern 280b of the active layer pattern 280 may include a binary compound containing indium, zinc (Zn), gallium (Ga), titanium (Ti), aluminum (Al), halfnium (Hf), zirconium (Zr), magnesium (Mn), or the like, a ternary compound (ABxCy), e.g., including such elements, a quaternary compound (ABxCyDz), e.g., including such elements, or the like. In some example embodiments, the semiconductor oxide layer pattern 280b may include a semiconductor oxide containing at least one selected from the group of indium (In), zinc (Zn), gallium (Ga), tin (Sn), titanium (Ti), aluminum (Al), hafnium (Hf), zirconium (Zr) and magnesium (Mg), or the like. In some example embodiments, the semiconductor oxide layer pattern 280b may include a semiconductor oxide doped with lithium (Li), sodium (Na), manganese (Mn), nickel (Ni), palladium (Pd), copper (Cu), carbon (C), nitrogen (N), phosphorus (P), titanium (Ti), zirconium (Zr), vanadium (V), rubidium (Ru), germanium (Ge), tin (Sn), fluorine (F), or the like. These may be used alone or in a mixture thereof.

In example embodiments, the semiconductor oxide layer pattern 280b may have a first area, and the graphene layer pattern 280a may have a second area that is smaller the first area. The graphene layer pattern 280a may be disposed on a portion of the gate insulating layer 260, the source electrode 270a, and the drain electrode 270b to thereby contact, e.g., directly contact, the source and the drain electrodes 270a and 270b. The semiconductor oxide layer pattern 280b may be extended to the source and the drain electrodes 270a and 270b while covering the graphene layer pattern 280a. In this case, the graphene layer pattern 280a may be substantially or fully covered by the semiconductor oxide layer pattern 280b. A disposition relationship between the graphene layer pattern 280a and the semiconductor oxide layer pattern 280b will be described below in detail.

FIGS. 9 to 12 illustrate cross sectional views of stages in a method forming transistor in accordance with some example embodiments.

In FIGS. 9 to 12, a method of manufacturing the transistor substantially the same as or substantially similar to that of the transistor described above with reference to FIG. 8 will be described. However, it will be appreciated that the method of manufacturing the transistor illustrated in FIGS. 9 to 12 may be employed in other transistors having various configurations where the gate electrode, the gate insulating layer, the source electrode, the drain electrode, the active layer, etc. may be disposed in various forms.

Figure 9:
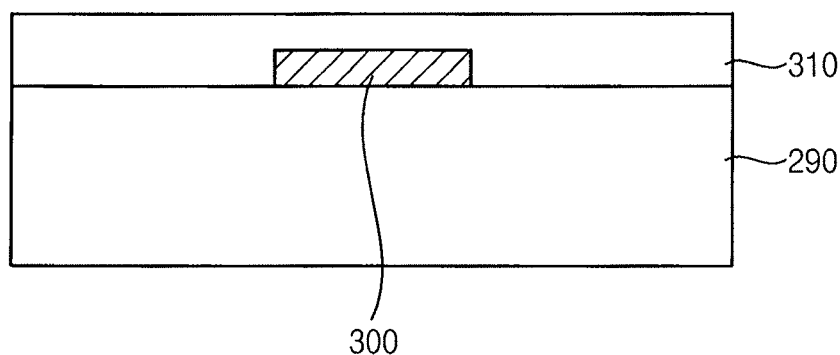
FIGS. 9 to 12 illustrate cross sectional views of stages in a method of forming a transistor in accordance with some example embodiments.

Referring to FIG. 9, a gate electrode 300 may be formed on a substrate 290 (including a transparent insulating substrate such as a glass substrate, a transparent resin substrate, a transparent metal oxide substrate, or the like). For example, a third conductive layer (not illustrated) may be formed on the substrate 290. Then, the third conductive layer may be partially etched by a photolithography process or an etching process using an additional etching mask. Hence, the gate electrode 300 may be provided on the substrate 290. The third conductive layer may be formed by a sputtering process, a CVD process, an ALD process, a vacuum evaporation process, a printing process, or the like. The gate electrode 300 may be formed using aluminum, an alloy containing aluminum, tungsten, copper, nickel, chromium, molybdenum, titanium, platinum, tantalum, an alloy thereof, a nitride thereof, or the like. The gate electrode 300 may have a single layer structure or a multi layer structure, which may include the conductive material, the heat resistance material, and/or the transparent conductive material.

In some example embodiments, the buffer layer (not illustrated) may be formed on the substrate 290. Thereafter, the gate electrode 300 may be formed on the buffer layer. The buffer layer may be formed using the silicon compound.

Referring now to FIG. 9, the gate insulating layer 310 (which covers the gate electrode 300) may be formed on the substrate 290. For example, the gate insulating layer 310 may be formed by a CVD process, a thermal oxidation process, a PECVD process, a HDP-CVD process, or the like. The gate insulating layer 310 may have a single layer structure or a multi layer structure, which may include silicon compound and/or a metal oxide.

Figure 10:
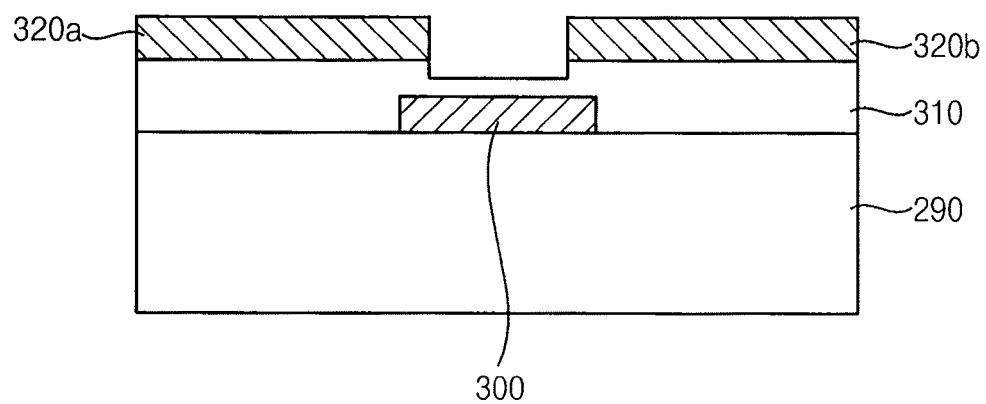

Referring to FIG. 10, the source electrode 320a and the drain electrode 320b may be formed on the gate insulating layer 310. In example embodiments, a fourth conductive layer (not illustrated) may be formed on the gate insulating layer 310. Then, the fourth conductive layer may be partially etched by a photolithography process or an etching process using an additional etching mask. Hence, the source electrode 320a and the drain electrode 320b may be provided on the gate insulating layer 310. The fourth conductive layer may be formed by a sputtering process, a CVD process, an ALD process, a vacuum evaporation process, a printing process, or the like. The source electrode 320a and the drain electrode 320b may be separated each other by a predetermined distance while substantially centering the gate electrode 300. The source electrode 320a and the drain electrode 320b may have a single layer structure or a multi layer structure, which may include a conductive material, a heat resistance material, and/or a transparent conductive material.

Figure 11:
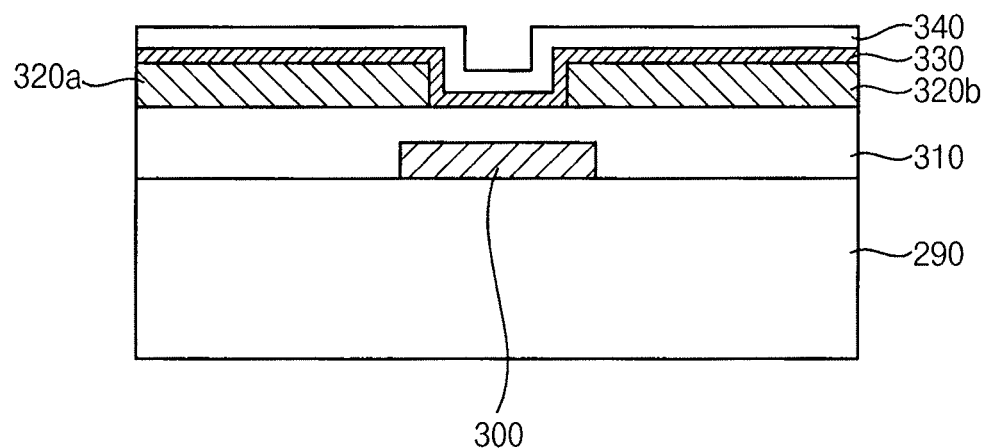

Referring to FIG. 11, graphene layer 330 may be formed on the portion of the gate insulating layer 310, the source electrode 320a, and the drain electrode 320b. Then, the semiconductor oxide layer 340 may be formed on the source and the drain electrodes 320a and 320b. For example, the graphene layer 330 and the semiconductor oxide layer 340 may be formed by a sputtering process, a CVD process, an ALD process, a vacuum evaporation process, or the like. Although FIG. 11 illustrates an example where the graphene layer 330 and the semiconductor oxide layer 340 have substantially the same thickness, in some example embodiments, the graphene layer 330 and the semiconductor oxide layer 340 may have different thicknesses.

Figure 12:
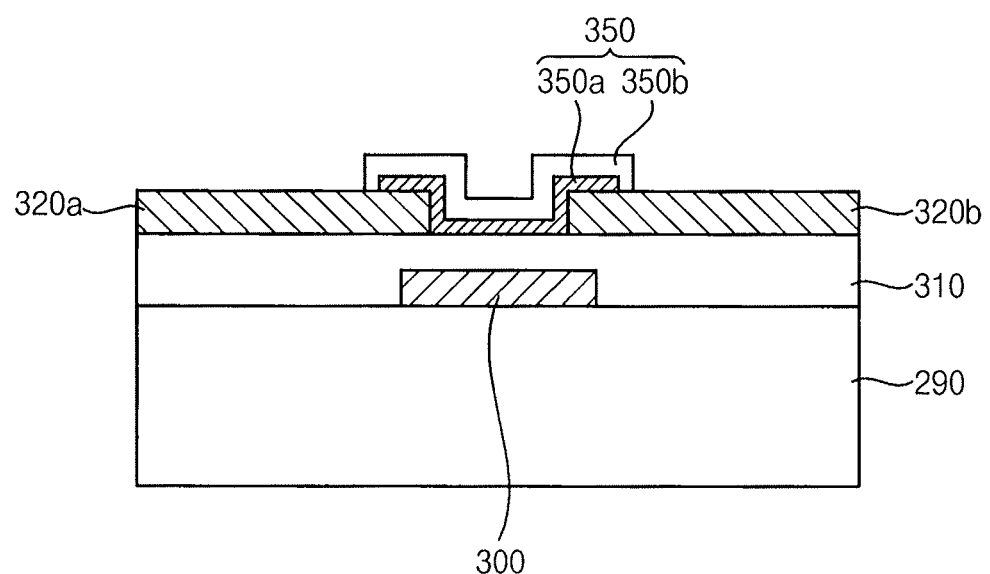

Referring to FIG. 12, the graphene layer 330 and the semiconductor oxide layer 340 may be partially etched to form the active layer pattern 350 including the graphene layer pattern 350a and the semiconductor oxide layer pattern 350b. In example embodiments, the semiconductor oxide layer pattern 350b may have a first area, and the graphene layer pattern 350a may have a second area that is smaller than, e.g., substantially smaller than, the first area. For example, the active layer pattern 350 including the graphene layer pattern 350a and the semiconductor oxide layer pattern 350b may be formed by a photolithography process or an etching process using an additional etching mask. When the active layer pattern 350 includes the graphene layer pattern 350a and the semiconductor oxide layer pattern 350b, the transistor including the active layer pattern 350 may help prevent a deterioration of the electrical characteristics (such as a reduction of a bias current, an increase of a threshold voltage distribution, and a reduction of mobility, to ensure that the transistor having the improved electrical characteristics is provided.

Figure 13:
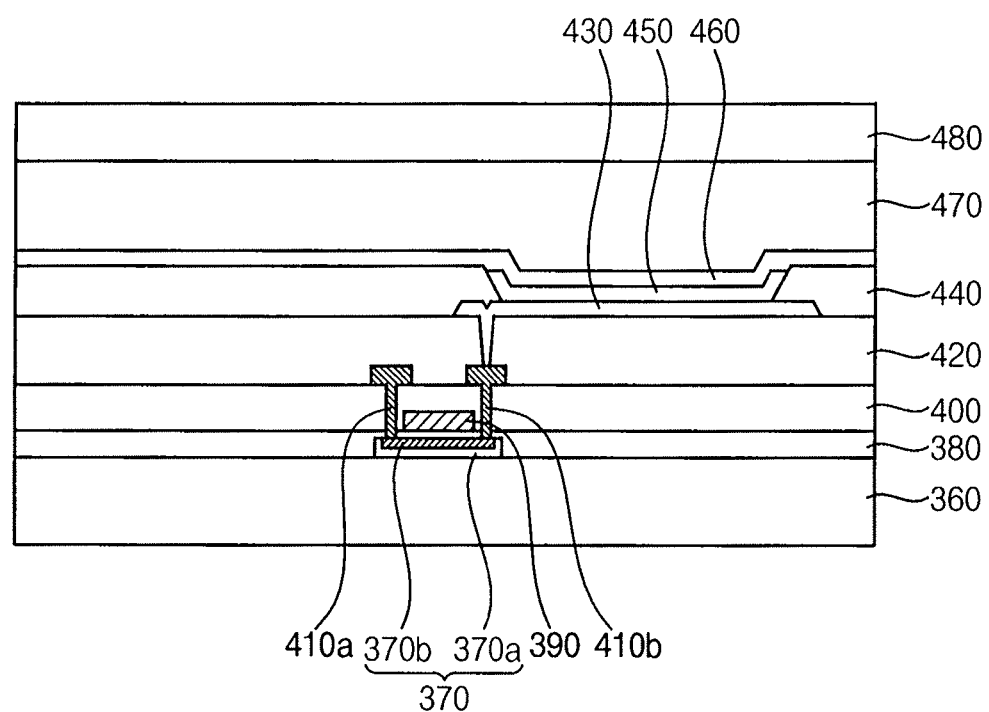
FIG. 13 illustrates a cross sectional view of a display device including a transistor in accordance with example embodiments.

FIG. 13 illustrates a cross sectional view of a display device including a transistor in accordance with example embodiments. With respect to FIG. 13, a display device including an organic light emitting layer will be described. However, it will be appreciated that the transistor may be employed in other transistors having various configurations where the active layer, the gate insulating layer, the gate electrode, the insulating interlayer, the source electrode, the drain electrode, etc. may be disposed in various forms.

A protecting layer or an insulation layer 420 may be disposed on the insulating interlayer 400 and the source and drain electrodes 410a and 410b. The insulation layer 420 may have a thickness to sufficiently cover the source and the drain electrodes 410a and 410b, and may have a substantially flat or level surface. The insulation layer 420 may be formed using an organic material or an inorganic material. For example, the insulation layer 420 may include photoresist, acryl-based resin, polyimide-based resin, polyamide-based resin, siloxane-based resin, resin containing photosensitive acrylic carboxyl group, novolak resin, alkali-soluble resin, silicon oxide, silicon nitride, silicon oxynitride, silicon oxycarbide, silicon carbon nitride, or the like. These may be used alone or in a combination thereof. According to a material included in the insulation layer 420, the insulation layer 420 may be formed by a spin coating process, a printing process, a sputtering process, a chemical vapor deposition process, an atomic layer deposition process, a plasma enhanced chemical vapor deposition process, a high density plasma-chemical vapor deposition process, a vacuum evaporation process, or the like.

By a photolithography process or an etching process using an additional etching mask, the insulation layer 420 may be partially etched to form a contact hole that exposes a portion of the drain electrode 410b of the switching device. A first electrode 430 may be formed on insulation layer 420 to substantially fill the contact hole. Thus, the first electrode 430 may make contact with the exposed portion of the drain electrode 410b. In some example embodiments, a contact (not illustrated), a plug (not illustrated), and/or a pad (not illustrated) may be formed on the drain electrode 410b to fill the contact hole. Thereafter, the first electrode 430 may be provided on the insulation layer 420 to be connected to the contact, the plug, or the pad. For example, the first electrode 430 may be electrically connected to the drain electrode 410b through the contact, the plug, or the pad.

When the organic light emitting structure has a top emission type or structure, the first electrode 430 may be formed using metal having reflectivity, an alloy having reflectivity, or the like. For example, the first electrode 430 may include aluminum (Al), silver (Ag), platinum (Pt), gold (Au), chromium (Cr), tungsten (W), molybdenum (Mo), titanium (Ti), palladium (Pd), iridium (Ir), alloys thereof, or the like. These may be used alone or in a combination thereof. Further, the first electrode 430 may be formed by a printing process, a sputtering process, a CVD process, an ALD process, a pulsed laser deposition process, a vacuum evaporation process, or the like.

A pixel defining layer 440 may be formed on the insulating layer 420 and the first electrode 430. The pixel defining layer 440 may be formed using an organic material or an inorganic material. For example, the pixel defining layer 440 may include photoresist, polyacryl-based resin, polyimide-based resin, acryl-based resin, silicon compound, or the like. Additionally, the pixel defining layer 440 may be formed on the insulating layer 420 and the first electrode 430 by a spin coating process, a spraying process, a printing process, a CVD process, or the like.

The pixel defining layer 440 may be partially etched to form an opening that exposes a portion of the first electrode 430. The opening of the pixel defining layer 440 may define the display region and a non-display region of the organic light emitting display device. For example, a portion of the organic light emitting display device may be the display region where the opening of the pixel defining layer 440 is located.

The light emitting structure 450 may be disposed on the exposed first electrode 430 and a portion of the pixel defining layer 440. The light emitting structure 450 may have a multi layer structure where includes an organic light emitting layer (EL), a hole injection layer (HIL), a hole transfer layer (HTL), an electron transfer layer (ETL), an electron injection layer (ETL), or the like. The organic light emitting layer of the light emitting structure 450 may include a material generating a red color of light, a material generating a green color of light, or a material generating a blue color of light, in accordance with pixels of the display device. In some example embodiments, the organic light emitting layer may have a multi layer stacked structure including material films for emitting a red color of light, a green color of light and a blue color of light to thereby generate a white color of light.

The second electrode 460 may be disposed on the light emitting structure 450 and the pixel defining layer 440. The second electrode 460 may include a transparent conductive material such as indium tin oxide, indium zinc oxide, tin oxide, zinc oxide, indium gallium oxide, gallium oxide, or the like. These may be used alone or in a combination thereof. Further, the second electrode 460 may be formed by a sputtering process, a chemical vapor deposition process, an atomic layer deposition process, a pulsed laser deposition process, a printing process, or the like.

The protecting layer 470 may be disposed on the second electrode 460. The protecting layer 470 may include a transparent material, and may have a substantially flat or level surface for the second substrate 480.

The second substrate 480 may be positioned on the protecting layer 470. The second substrate 480 may include a transparent insulation substrate. For example, the second substrate 480 may include a glass substrate, a quartz substrate, a transparent resin substrate, or the like. In some example embodiments, the second substrate 480 may be positioned on the second electrode 460. In this case, a predetermined space may be provided between the second electrode 470 and the second substrate 480. This space may be filled with an air or an inactive gas such as a nitrogen ($N_2$) gas.

According to example embodiments, the display device may include the transistor that has desirable electrical characteristics, e.g., an increase of a bias current, a reduction of a threshold voltage distribution, and an increase of a mobility in the channel region, or the like, so that the display device having the transistor may have a reduced thickness, an increased resolution of images displayed by the display device, and improved operating speed of images.

According to example embodiments, the transistor having the desirable electrical characteristics, e.g., the increased bias current, the reduced threshold voltage distribution, and the increased mobility in the channel region, or the like, may be implemented. When the transistor is employed in a display device, e.g., the organic light emitting display device, the liquid crystal display device, the flexible display device, or the like, the display device having the transistor may have a reduced thickness, increased quality of images displayed by the display device, and improved operating speed of images.

By way of summation and review, when an active layer includes amorphous silicon, the transistor may have a relatively low mobility. Thus, a display device including such a transistor (with the amorphous silicon) may not operate at high speed. Alternatively, when the active layer includes polysilicon, the transistor may have a relatively high mobility. However, the transistor may have a non-uniform threshold voltage. Thus the transistor with the polysilicon may require an additional circuit, e.g., a compensating circuit.

Graphene transistor may have an active layer including graphene semiconductor. However, characteristics of graphene may not be easily controlled. Thus, a deterioration of electrical characteristics of the graphene transistor, e.g., the increase of a threshold voltage distribution, the reduction of mobility, the reduction of an operating current, etc., may occur The embodiments provide transistors having an active layer with a double structure.

Example embodiments provide a transistor having an improved electrical characteristic by including an active layer with a double structure.

Example embodiments provide a method of manufacturing a transistor having an improved electrical characteristic by including an active layer with a double structure.

Example embodiments provide a display device including a transistor which has an improved electrical characteristic by including an active layer with a double structure.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Accordingly, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A transistor, comprising:
   a substrate;
   a gate electrode disposed on the substrate;
   a gate insulating layer disposed on the gate electrode;
   a source electrode and a drain electrode disposed on the gate insulating layer; and
   an active layer pattern disposed on a portion of the gate insulating layer, the source electrode and the drain electrode, the active layer pattern including graphene and a semiconductor oxide.

2. The transistor of claim 1, wherein the active layer pattern includes:
   graphene layer pattern disposed on the portion of the gate insulating layer, the source electrode, and the drain electrode; and
   a semiconductor oxide layer pattern disposed on the graphene layer pattern, the source electrode, and the drain electrode.

3. The transistor of claim 2, wherein the semiconductor oxide layer pattern includes the semiconductor oxide, the semiconductor oxide including at least one selected from the group of indium (In), zinc (Zn), gallium (Ga), tin (Sn), titanium (Ti), aluminum (Al), hafnium (Hf), zirconium (Zr) and magnesium (Mg).

4. The transistor of claim 3, wherein the semiconductor oxide layer pattern includes a composition in which at least one selected from the group of lithium (Li), sodium (Na), manganese (Mn), nickel (Ni), palladium (Pd), copper (Cu), carbon (C), nitrogen (N), phosphorus (P), titanium (Ti), zirconium (Zr), vanadium (V), rubidium (Ru), germanium (Ge), tin (Sn), and fluorine (F) is added to the semiconductor oxide.

5. The transistor of claim 2, wherein the graphene layer pattern is in contact with the source electrode and the drain electrode.

6. A method of manufacturing a transistor, the method comprising:
   forming a gate electrode on a substrate;
   forming a gate insulating layer covering the gate electrode on the substrate;
   forming a source electrode and a drain electrode on the gate insulating layer; and
   forming an active layer pattern on a portion of the gate insulating layer, the source electrode, and the drain electrode such that the active layer pattern includes graphene and a semiconductor oxide.

7. The method of claim 6, wherein forming the active layer pattern includes a sputtering process, a chemical vapor deposition process, an atomic layer deposition process, or a vacuum deposition process.

8. The method of claim 6, wherein forming the active layer pattern includes:
   forming graphene layer on the portion of the gate insulating layer, the source electrode and the drain electrode;
   forming a semiconductor oxide layer on the graphene layer; and
   partially etching the semiconductor oxide layer and the graphene layer to form the active layer pattern having graphene layer pattern and a semiconductor oxide layer pattern.

9. A display device, comprising:
a first substrate;
a gate electrode disposed on the first substrate;
a gate insulating layer disposed on the gate electrode;
a source electrode and a drain electrode disposed on the gate insulating layer;
an active layer pattern disposed on a portion of the gate insulating layer, the source electrode and the drain electrode, the active layer pattern including graphene and a semiconductor oxide;
a first electrode configured in electrical contact with the drain electrode;
a light emitting structure disposed on the first electrode;
a second electrode disposed on the light emitting structure; and
a second substrate disposed on the second electrode.

* * * * *